United States Patent
Chen et al.

(10) Patent No.: US 10,741,720 B2
(45) Date of Patent: Aug. 11, 2020

(54) PLASMONIC LIGHT EMITTING DIODE

(71) Applicant: INTERNATIONAL BUSINESS MACHINES CORPORATION, Armonk, NY (US)

(72) Inventors: Yaojia Chen, Jersey City, NJ (US); Ning Li, White Plains, NY (US); Devendra K. Sadana, Pleasantville, NY (US); Jinghui Yang, Los Angeles, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/272,374

(22) Filed: Feb. 11, 2019

(65) Prior Publication Data
US 2019/0189842 A1  Jun. 20, 2019

Related U.S. Application Data

(63) Continuation of application No. 15/887,336, filed on Feb. 2, 2018, now Pat. No. 10,263,142, which is a continuation of application No. 15/266,088, filed on Sep. 15, 2016, now Pat. No. 9,935,239.

(51) Int. Cl.
*H01L 33/00* (2010.01)
*H01L 33/06* (2010.01)
(Continued)

(52) U.S. Cl.
CPC .......... *H01L 33/06* (2013.01); *H01L 33/0062* (2013.01); *H01L 33/30* (2013.01);
(Continued)

(58) Field of Classification Search
CPC ......... H01L 33/06; H01L 33/30; H01L 33/60; H01L 33/0062; H01L 33/58; H01L 33/64;
(Continued)

(56) References Cited

U.S. PATENT DOCUMENTS 7,010,183 B2 * 3/2006 Estes ................. B82Y 20/00
359/333
8,653,550 B2  2/2014 Mastro
(Continued)

FOREIGN PATENT DOCUMENTS

CN  102034913 A  4/2011
JP  2011216555 A  10/2011
(Continued)

OTHER PUBLICATIONS

Bhushan, Chapter 2, Surface Roughness Analysis and Measurement Techniques, 2000, CRC Press, Dec. 28, 2000.*
(Continued)

*Primary Examiner* — Nikolay K Yushin
(74) *Attorney, Agent, or Firm* — Tutunjian & Bitetto, P.C.; Erik Johnson

(57) ABSTRACT

A light emitting diode includes a square quantum well structure, the quantum well structure including III-V materials. A dielectric layer is formed on the quantum well structure. A plasmonic metal is formed on the dielectric layer and is configured to excite surface plasmons in a waveguide mode that is independent of light wavelength generated by the quantum well structure to generate light.

20 Claims, 6 Drawing Sheets

(51) Int. Cl.
  *H01L 33/30* (2010.01)
  *H01L 33/60* (2010.01)
  *H01L 33/58* (2010.01)
  *B82Y 10/00* (2011.01)
  *B82Y 30/00* (2011.01)
  *H01L 33/64* (2010.01)
  *B82Y 20/00* (2011.01)

(52) U.S. Cl.
  CPC .............. *H01L 33/58* (2013.01); *H01L 33/60* (2013.01); *B82Y 10/00* (2013.01); *B82Y 20/00* (2013.01); *B82Y 30/00* (2013.01); *H01L 33/64* (2013.01); *H01L 2933/0058* (2013.01)

(58) Field of Classification Search
  CPC ..... H01L 2933/0058; H01L 2933/0083; H01L 2933/0033; H01L 2933/0066; B82Y 10/00; B82Y 30/00; B82Y 20/00
  See application file for complete search history.

(56) References Cited

U.S. PATENT DOCUMENTS

| | | |
|---|---|---|
| 8,779,456 B2 | 7/2014 | Mastro |
| 9,263,637 B2 * | 2/2016 | Tan .......................... H01L 33/02 |
| 9,263,689 B2 | 2/2016 | O'Carroll et al. |
| 2003/0179974 A1 * | 9/2003 | Estes ...................... B82Y 20/00 385/2 |
| 2009/0114940 A1 * | 5/2009 | Yang ...................... H01L 33/44 257/99 |
| 2011/0272669 A1 * | 11/2011 | Tan .......................... H01L 33/02 257/13 |
| 2012/0153254 A1 | 6/2012 | Mastro |
| 2014/0103291 A1 | 4/2014 | Mastro |
| 2014/0225091 A1 | 8/2014 | O'Carroll et al. |
| 2016/0087143 A1 | 3/2016 | Teo et al. |

FOREIGN PATENT DOCUMENTS

| | | |
|---|---|---|
| WO | 02073707 A1 | 9/2002 |
| WO | 2005081813 A2 | 3/2006 |
| WO | 2009096919 A1 | 8/2009 |

OTHER PUBLICATIONS

List of IBM Patents or Patent Applications Treated as Related dated Feb. 11, 2019, 2 pages.

* cited by examiner

PLASMONIC LIGHT EMITTING DIODE

BACKGROUND

Technical Field

The present invention relates to light emitting diodes, and more particularly to plasmonic light emitting diodes formed on-chip to provide greater output and a smaller footprint.

Description of the Related Art

High performance miniaturized light emitting diodes (LEDs) provide a promising device for applications, such as, next generation bio-sensing components and optical links. Conventional plasmonic LEDs need to match a metal resonance wavelength with a semiconductor gain spectrum, which force structural and material limitations on the devices.

SUMMARY

In accordance with an embodiment of the present invention, a light emitting diode includes a square quantum well structure, the quantum well structure including III-V materials. A dielectric layer is formed on the quantum well structure. A plasmonic metal is formed on the dielectric layer and is configured to excite surface plasmons in a waveguide mode that is independent of light wavelength generated by the quantum well structure to generate light.

Another light emitting diode includes a glass substrate and a square quantum well structure mounted of the glass substrate, the quantum well structure including alternating layers of III-V materials to generate light using optical pumping. A dielectric layer is formed on the quantum well structure. A plasmonic metal is formed on the dielectric layer and is configured to excite surface plasmons in a waveguide mode independent of light wavelength generated by the quantum well structure.

A method for fabricating a light emitting diode includes forming a square quantum well structure on a substrate, the quantum well structure including III-V materials; forming a dielectric layer on the quantum well structure; and depositing a plasmonic metal on the dielectric layer, the plasmonic metal being configured to excite surface plasmons in a waveguide mode independently of light wavelength generated by the quantum well structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
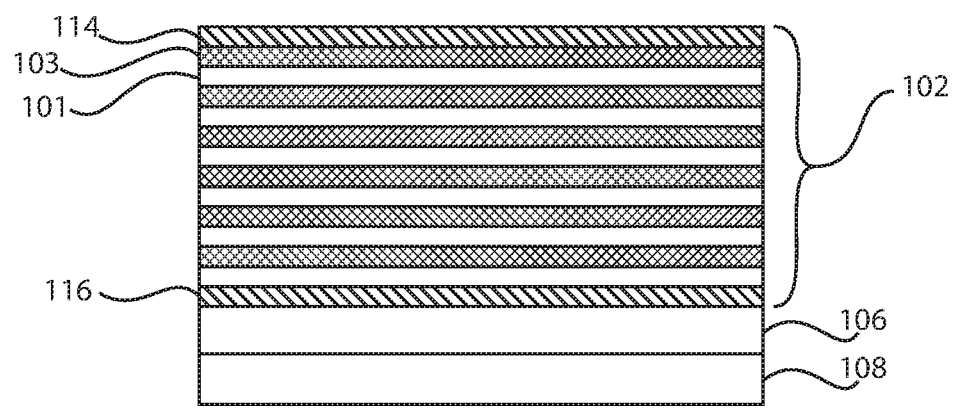
FIG. 1 is a cross-sectional view showing a quantum well (QW) arrangement with a dielectric layer and plasmonic metal for enhancing output of a microcavity diode in accordance with an embodiment of the present invention.

Aspects of the present invention include a propagating plasmonic mode light emitting diode that functions at any wavelength. Useful embodiments include a propagating surface plasmonic mode to provide microcavity LEDs with enhanced light output. For LEDs, emission intensity scales linearly with input power. With a same active region size, a plasmonic LED in accordance with embodiments of the present invention provides an enhancement of a factor of about 2 or greater as compared to conventional LEDs. Compared between different device sizes, emission intensity approximately scales with area, e.g., emission intensity is approximately ∫Intensity*area.

In one embodiment, the plasmonic LED may be formed using III-V materials and placed on substrates, such as Si, to enable the formation of additional circuits using complementary metal oxide semiconductor (CMOS) processing. In other embodiments, the plasmonic mode LED can be employed with III-V active materials on a glass substrate for optical coupling. A plasmonic mode is employed for enhancing light coupling efficiency into a waveguide. The plasmonic mode includes employing plasmonic surface excitation to generate photons.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., GaAs. These compounds include different proportions of the elements within the compound, e.g., GaAs includes $Ga_xAs_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It, will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a plasmonic light emitting diode (LED) 100 is shown in accordance with one embodiment. The LED 100 includes a periodic quantum well (QW) arrangement or structure 102. In one embodiment, the QW arrangement 102 includes GaAs QWs with alternating layers of different GaAs materials (e.g., AlGaAs and GaAs). The alternating layers may number between, e.g., 10 and 100 and include a relationship with the wavelength of generated light to achieve light amplification. In one embodiment, the QW 102 (or multiple quantum well (MQW)) active regions may include alternating layers of, e.g., 10 nm GaAs/10 nm AlGaAs ($Al_{0.3}$, $Ga_{0.7}As$). For example, layers 101 and 103 may respectively include GaAs and AlGaAs.

The LED 100 is preferably optically pumped using a laser or diode. The optical pumping provides an input power to the diode. The input power is enhanced to provide an enhanced emission using plasmonic excitation. The optical pump can be included in the QW structure 102, or may be included in a separate device. The optical pumping can be done with a light source having a photon energy larger than a bandgap of LED 100 materials.

The structure 102 can be formed on a dielectric layer 106. The dielectric layer 106 can include a material such as aluminum oxide ($Al_2O_3$) or other suitable material. A plasmonic metal 108 is formed in contact with the dielectric layer 104.

The QW arrangement 102 includes III-V gain materials (e.g., GaAs, InGaAs, GaN, InGaAl, etc.) formed in proximity of the plasmonic metal 108. The periodic quantum well (QW) arrangement or structure 102 is sandwiched between top 114 and bottom 116 buffer/contact layers. The buffer or contact layers 114 and 116 may include a material such as $Al_{0.3}Ga_{0.7}As$, although other compositions and materials may be employed. Instead of or in addition to the buffer layers 114 and 116, highly doped contact layers (114, 116) may be formed. The contact layer 114 may be, e.g., 20 nm thick and may include highly doped GaAs. A second electrode 116 (or the electrode can be connected to layer 116) can be formed using an n+ doped layer or a side contact may be employed. In one embodiment, a thin highly doped layer is employed for making the contact 116.

The metal 108 may include, e.g., Au, although other metals may be employed (e.g., Cu, Ag, Al, etc.). The light generated in the QW arrangement 102 causes plasmonic activity in the plasmonic material 108 to excite electrons in the metal 108. The LED 100 generates light using the plasmonic/photonic properties of the device to produce light (as a laser or light emitting diode (LED)). The plasmonic metal 108 is formed on the dielectric layer 106 and is configured to excite surface plasmons in a waveguide mode that is independent of light wavelength generated by the quantum well structure 102. The plasmons are generated in a waveguide mode (through dielectric layer 106) and can include any wavelength. The plasmonic metal 108 can also include a dielectrically-loaded surface plasmon polariton (DLSPP) mode. The transmission properties of the DLSPP mode depends on the wavelength of the light.

The metal 108 may include a thickness of between about 50 nm to about 300 nm. The metal 108 may also provide heat sink properties to reduce the operating temperature of the device 100 and provide a reflective surface to reduce photon loss. In one example, estimates of pump power loss between a device 100 and a conventional device having the same dimensions without a plasmonic metal layer 108, using a transfer matrix method, result in significant decreases in power loss. For example, loss at the bottom surface of the device (where the plasmonic metal layer 108 is in device 100 and a corresponding surface in the conventional device) was about 32.4% for the conventional device and only 26.5% for the device 100 in accordance with the present embodiments. In addition to reduced loss, the present device 100 provides enhanced light emission with comparable pump levels at active layers as compared to those for conventional devices.

Figure 2:
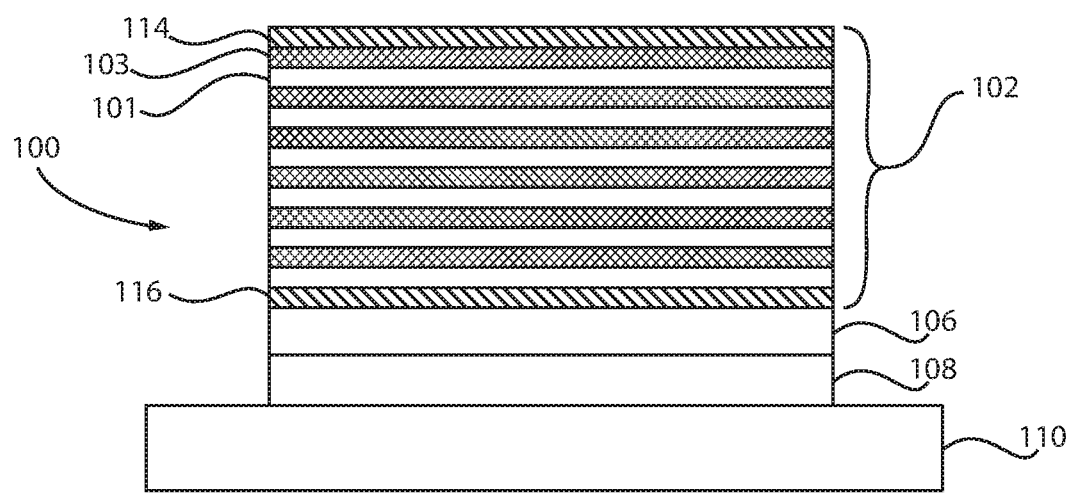
FIG. 2 is a cross-sectional view showing another quantum well (QW) arrangement with a dielectric layer and plasmonic metal for enhancing output of a microcavity diode bonded to a glass substrate in accordance with another embodiment of the present invention.

Referring to FIG. 2, the QW arrangement 102 can be formed on a substrate 110. The LED 100 may be bonded on a $SiO_2$/Si material as the substrate 110 or monolithically grown on GaAs as the substrate 110. In one embodiment, the Si substrate 110 is compatible with CMOS processing. The substrate 110 may include field effect transistors, lasers, diodes, bio-sensing components or other devices formed thereon. In other embodiments, the LED 100 may be bonded to a glass substrate 110. In such embodiments, the substrate 110 may be removed (e.g., by etching) to expose the plasmonic metal 108, and the metal 108 may be bonded to the glass (or other suitable material) substrate. In one embodiment, the device 100 is wax bonded to a glass substrate.

The embodiments depicted in FIGS. 1 and 2 can include the plasmonic LED structure 100 with a thin layer (e.g., about 100 nm) of metal 108 and a thin layer (about 20 nm to about 500 nm) of light emission layer(s) 102. A preferred metal 108 includes material having low absorption loss at the working wavelength. For near infrared, Au, Ag, Cu are preferred options. The light emission layer 102 can include III-V compound semiconductor quantum wells.

In one embodiment, the square cavity integrated nano-cavity plasmonic light source 100 may include a 10 micron× 10 micron footprint. Other sizes can be 3 microns×3 microns and as low as submicron dimensions. In one embodiment, the square cavity plasmonic LED light source 100 can include a 250 nm×250 nm footprint or less.

Figure 3:
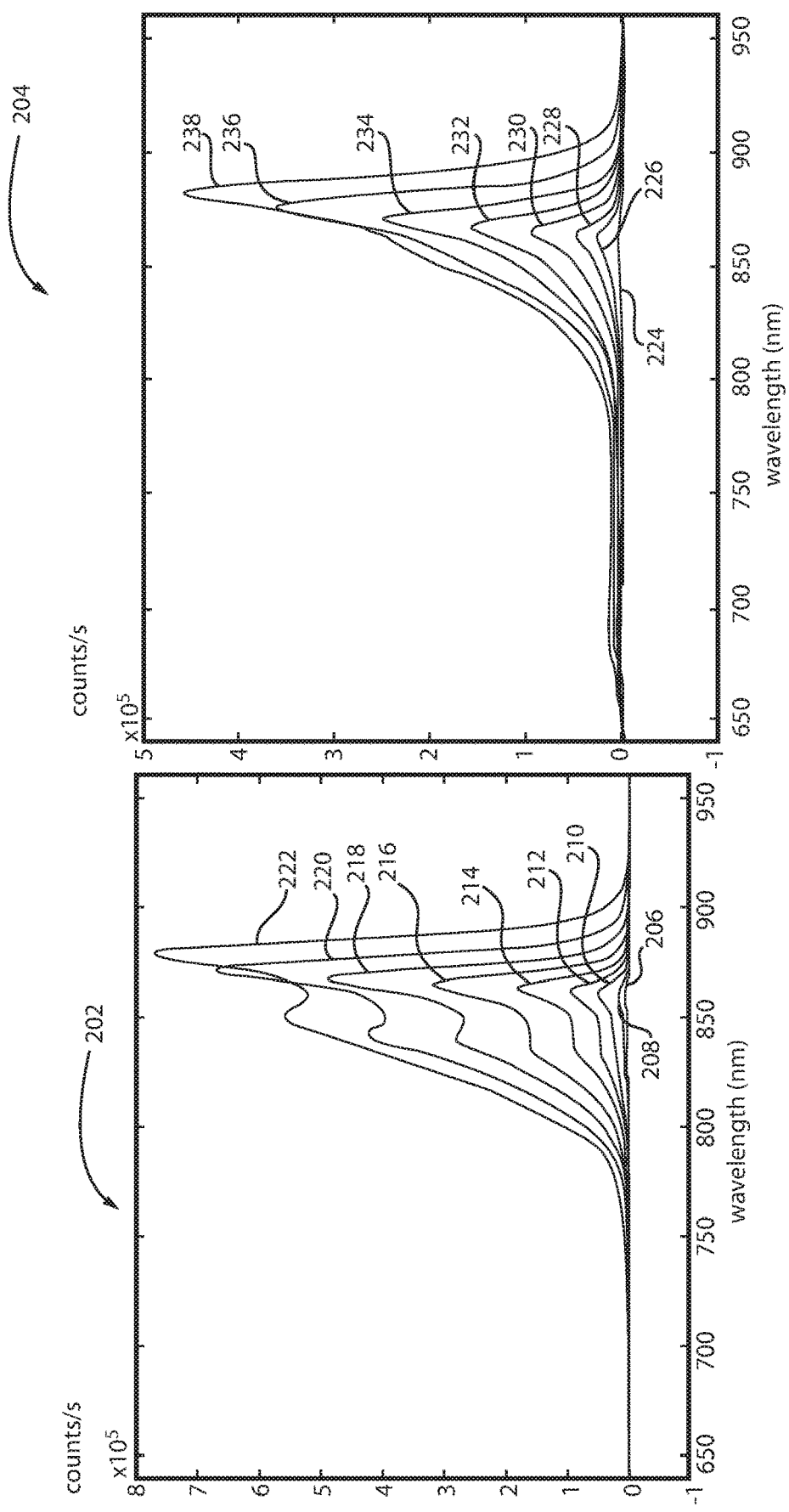
FIG. 3 shows graphs of emission intensity (counts/s) versus wavelength for a plasmonic device and a conventional device, the devices being 10 microns square in accordance with an embodiment of the present invention.

Referring to FIG. 3, light emission measurements are plotted on a graph 202 for a plasmonic LED in accordance with a present embodiment. For comparison, light emission measurements are plotted on a graph 204 for a conventional LED. Graphs 202 and 204 depict emission peak intensity (photon counts/second ($\times 10^5$)) on the y-axis and wavelength (nm) on the x-axis. The LEDs employed in graphs 202 and 204 include a 10 micron square device. Plotted in each graph 202, 204 are a number or traces (traces 206-222 in graph 202 and traces 224-238 in graph 204). The traces show varying effective input powers in microWatts. Table 1 shows the effective input powers versus traces in FIG. 3.

TABLE 1

| | Input power: | |
|---|---|---|
| Power (microW) | Traces in graph 202 (present embodiment) | Traces in graph 204 (conventional) |
| 8.79 | Trace 206 | Trace 224 |
| 17.75 | Trace 208 | No trace |
| 29.2 | Trace 210 | Trace 226 |
| 46.31 | Trace 212 | Trace 228 |
| 71.8 | Trace 214 | Trace 230 |
| 105.5 | Trace 216 | Trace 232 |
| 156 | Trace 218 | Trace 234 |
| 232.8 | Trace 220 | Trace 236 |
| 346.2 | Trace 222 | Trace 238 |

Devices employed included GaAs MQW with plasmonic metal (graph 202) and without metal (graph 204) at the bottom of the device. In addition, the substrate was removed, and the devices were bonded by wax on glass. Emission intensity scales linearly with input power for the plasmonic device of graph 202. With the same size of active region as conventional devices, the plasmonic LED in accordance with aspects of the present invention (graph 202) provides a count/s enhancement by a factor of ~2 compared with conventional LEDs of graph 204.

Figure 4:
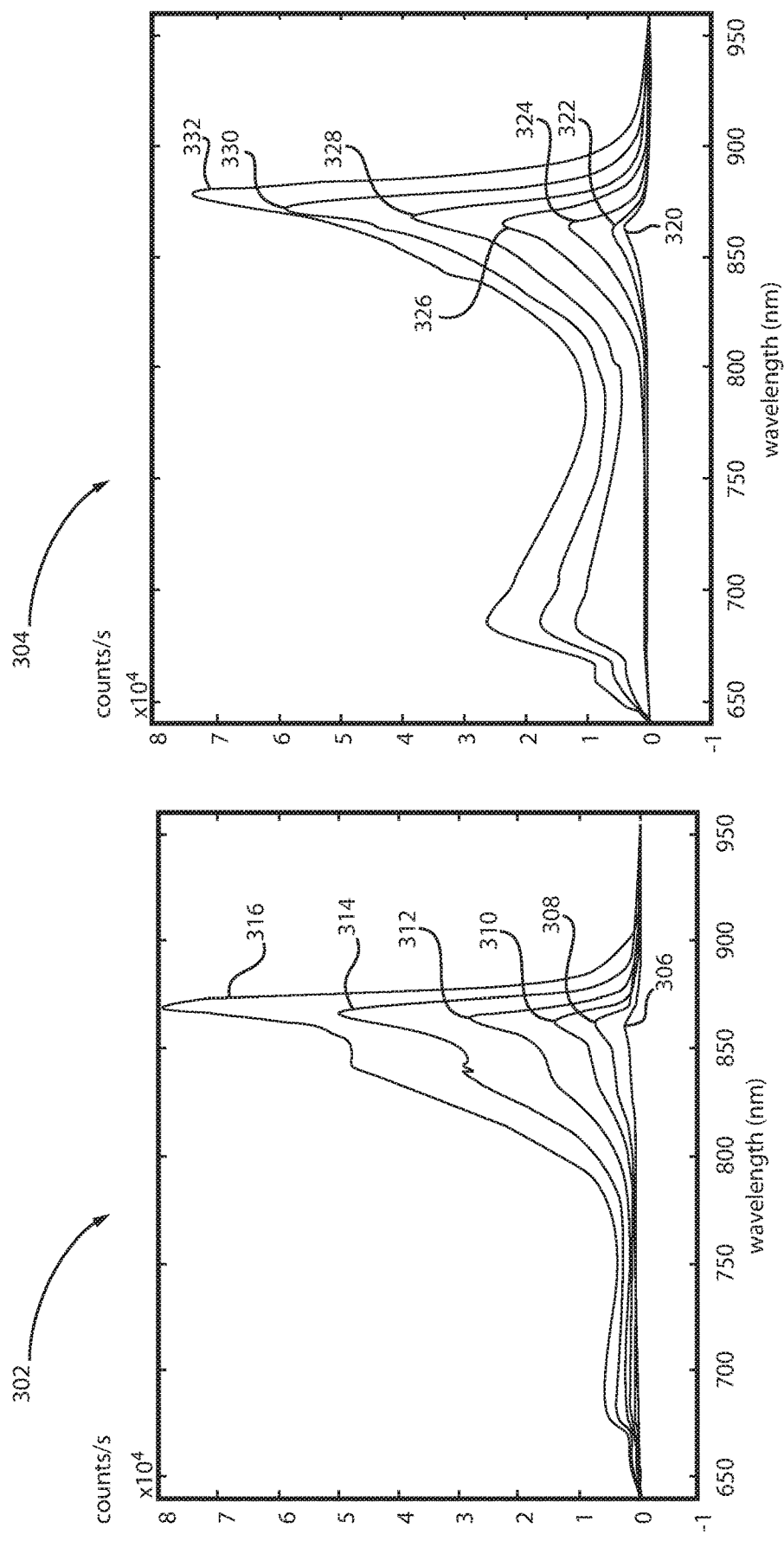
FIG. 4 shows graphs of emission intensity (counts/s) versus wavelength for a plasmonic device and a conventional device, the devices being 5 microns square in accordance with an embodiment of the present invention.

Referring to FIG. 4, light emission measurements are plotted on a graph 302 for a plasmonic LED in accordance with a present embodiment. For comparison, light emission measurements are plotted on a graph 304 for a conventional LED. Graphs 302 and 304 depict emission peak intensity (photon counts/second ($\times 10^4$)) on the y-axis and wavelength (nm) on the x-axis. The LEDs employed in graphs 302 and 304 include a 5 micron square device. Plotted in each graph 302, 304 are a number or traces (traces 306-316 in graph 302 and traces 320-332 in graph 304). The traces show varying effective input powers in microWatts. Table 2 shows the effective input powers versus traces in FIG. 4.

TABLE 2

| | Input power: | |
|---|---|---|
| Power (microW) | Traces in graph 302 (present embodiment) | Traces in graph 304 (conventional) |
| 8.79 | Trace 306 | Trace 320 |
| 17.75 | Trace 308 | Trace 322 |

TABLE 2-continued

| | Input power: | |
|---|---|---|
| Power (microW) | Traces in graph 302 (present embodiment) | Traces in graph 304 (conventional) |
| 29.2 | Trace 310 | Trace 324 |
| 46.31 | Trace 312 | Trace 326 |
| 71.8 | Trace 314 | Trace 328 |
| 105.5 | Trace 316 | Trace 330 |
| 156 | No Trace | Trace 332 |

Devices employed included GaAs MQW with plasmonic metal (graph 302) and without metal (graph 304) at the bottom of the device. In addition, the substrate was removed, and the devices were bonded by wax on glass. Emission intensity scales linearly with input power for the plasmonic device of graph 302. With the same size of active region as conventional devices, the plasmonic LED in accordance with aspects of the present invention (graph 302) provides a count/s enhancement by a factor of ~2 compared with conventional LEDs of graph 304.

Figure 5:
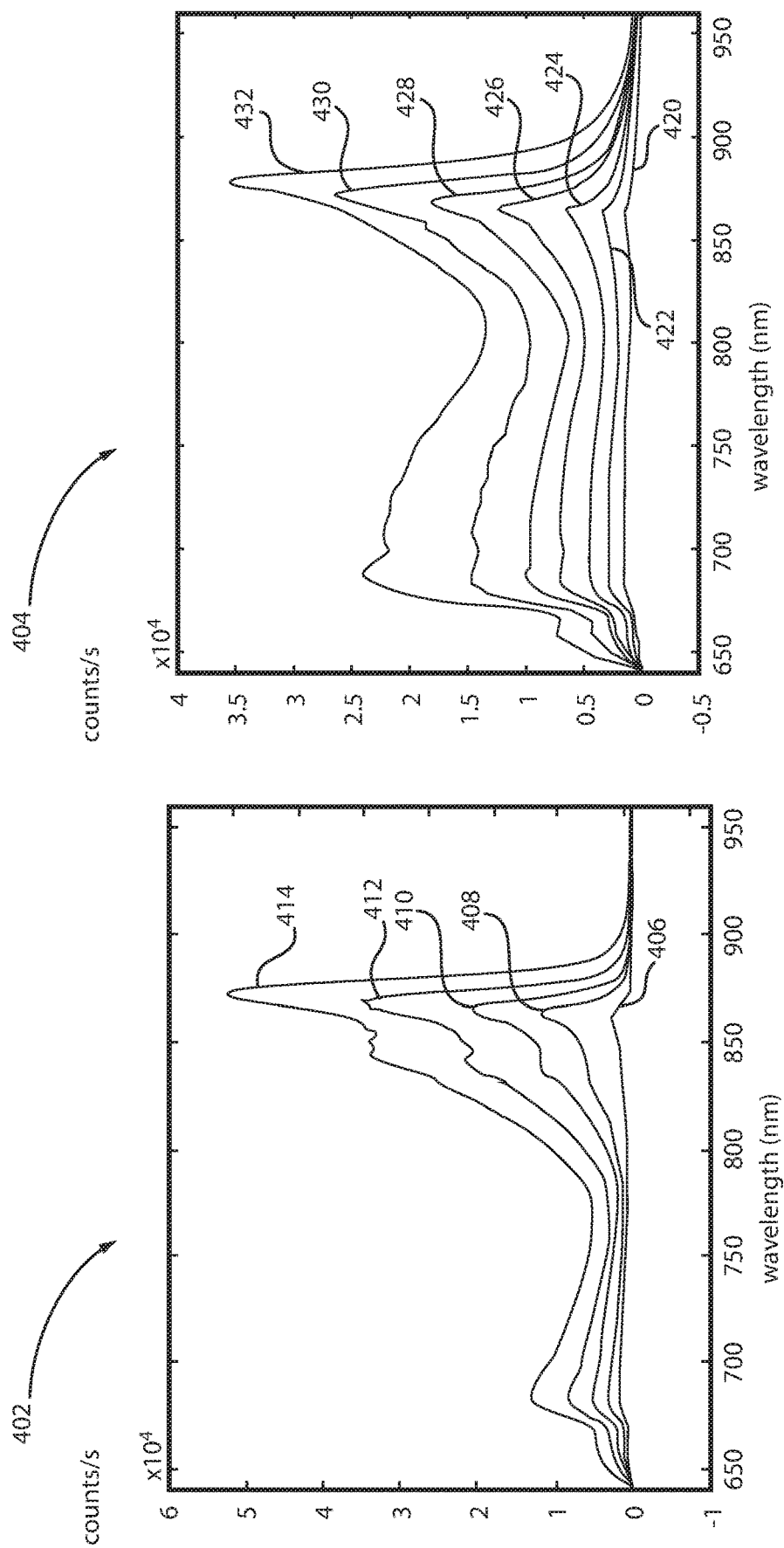
FIG. 5 shows graphs of emission intensity (counts/s) versus wavelength for a plasmonic device and a conventional device, the devices being 4 microns square in accordance with an embodiment of the present invention.

Referring to FIG. 5, light emission measurements are plotted on a graph 402 for a plasmonic LED in accordance with a present embodiment. For comparison, light emission measurements are plotted on a graph 404 for a conventional LED. Graphs 402 and 404 depict emission peak intensity (photon counts/second ($\times 10^4$)) on the y-axis and wavelength (nm) on the x-axis. The LEDs employed in graphs 402 and 404 include a 4 micron square device. Plotted in each graph 402, 404 are a number or traces (traces 406-416 in graph 402 and traces 420-432 in graph 404). The traces show varying effective input powers in microWatts. Table 3 shows the effective input powers versus traces in FIG. 5.

TABLE 3

| | Input power: | |
|---|---|---|
| Power (microW) | Traces in graph 302 (present embodiment) | Traces in graph 304 (conventional) |
| 8.79 | Trace 406 | Trace 420 |
| 17.75 | No Trace | Trace 422 |
| 29.2 | Trace 408 | Trace 424 |
| 46.31 | Trace 410 | Trace 426 |
| 71.8 | Trace 412 | Trace 428 |
| 105.5 | Trace 414 | Trace 430 |
| 156 | No Trace | Trace 432 |

Devices employed included GaAs MQW with plasmonic metal (graph 402) and without metal (graph 404) at the bottom of the device. In addition, the substrate was removed, and the devices were bonded by wax on glass. Emission intensity scales linearly with input power for the plasmonic device of graph 402. With the same size of active region as conventional devices, the plasmonic LED in accordance with aspects of the present invention (graph 402) provides a count/s enhancement by a factor of ~2 compared with conventional LEDs of graph 404.

Figure 6:
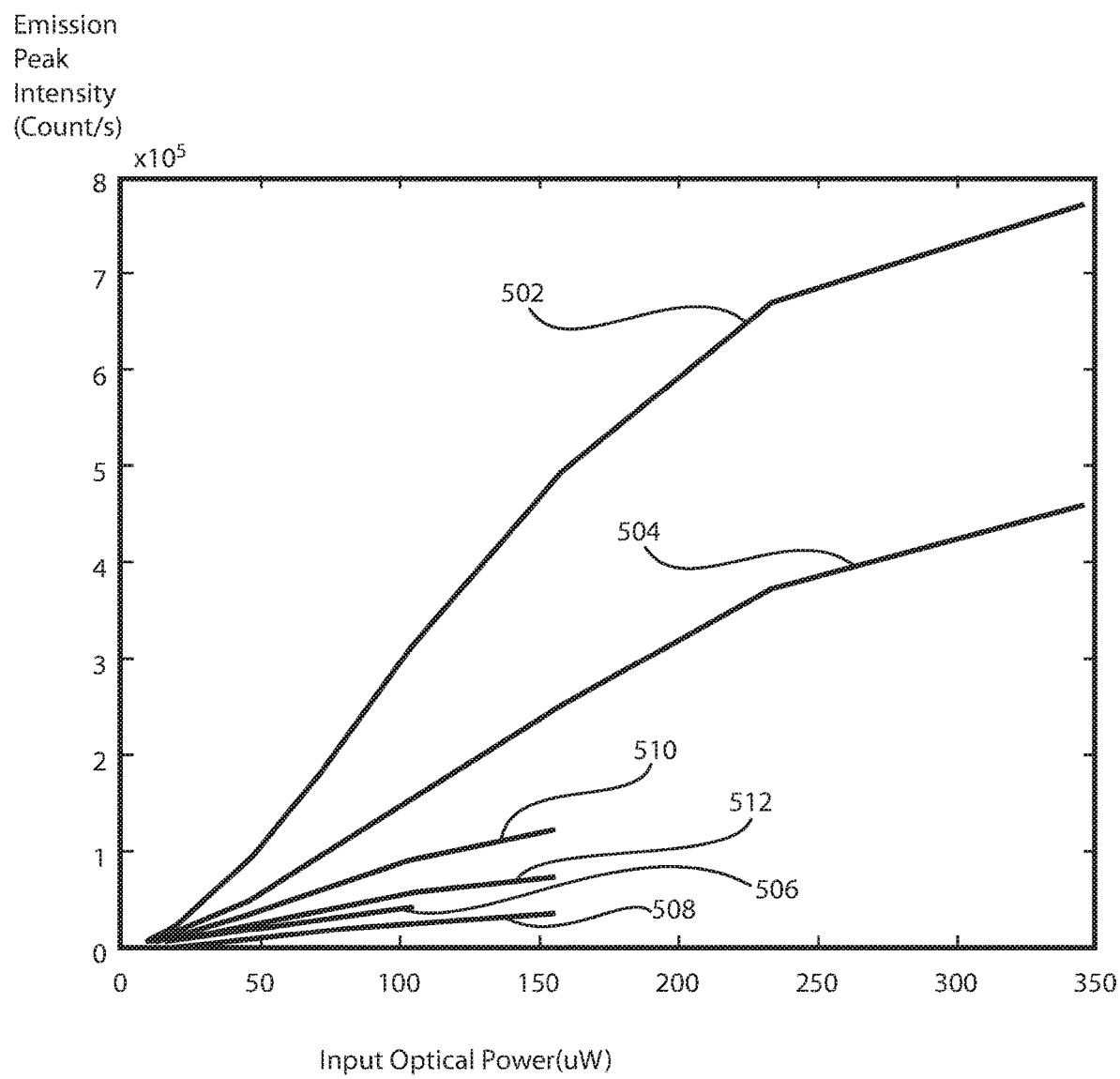
FIG. 6 shows a graph of emission intensity (counts/s) versus input optical power (microWatts) for a 10 micron square plasmonic device, a 5 micron square plasmonic device, a 4 micron square plasmonic device and control devices of the same sizes in accordance with embodiments of the present invention.

Referring to FIG. 6, in accordance with aspects of the present invention, for different sized plasmonic devices (e.g., 10 micron square, 5 micron square, 4 micron square, etc.), emission intensity approximately scales with area, e.g., emission intensity ∝ area. FIG. 6 shows emission peak intensity (counts/s) ($\times 10^5$) versus input optical power (microWatts) for devices of different sizes. Trace 502 is a plot for a 10 micron square plasmonic device. Trace 504 is a plot for a 10 micron square control device (conventional) for comparison. Trace 506 is a plot for a 5 micron square plasmonic device. Trace 508 is a plot for a 5 micron square control device (conventional) for comparison. Trace 510 is a plot for a 4 micron square plasmonic device. Trace 512 is a plot for a 4 micron square control device (conventional) for comparison.

Figure 7:
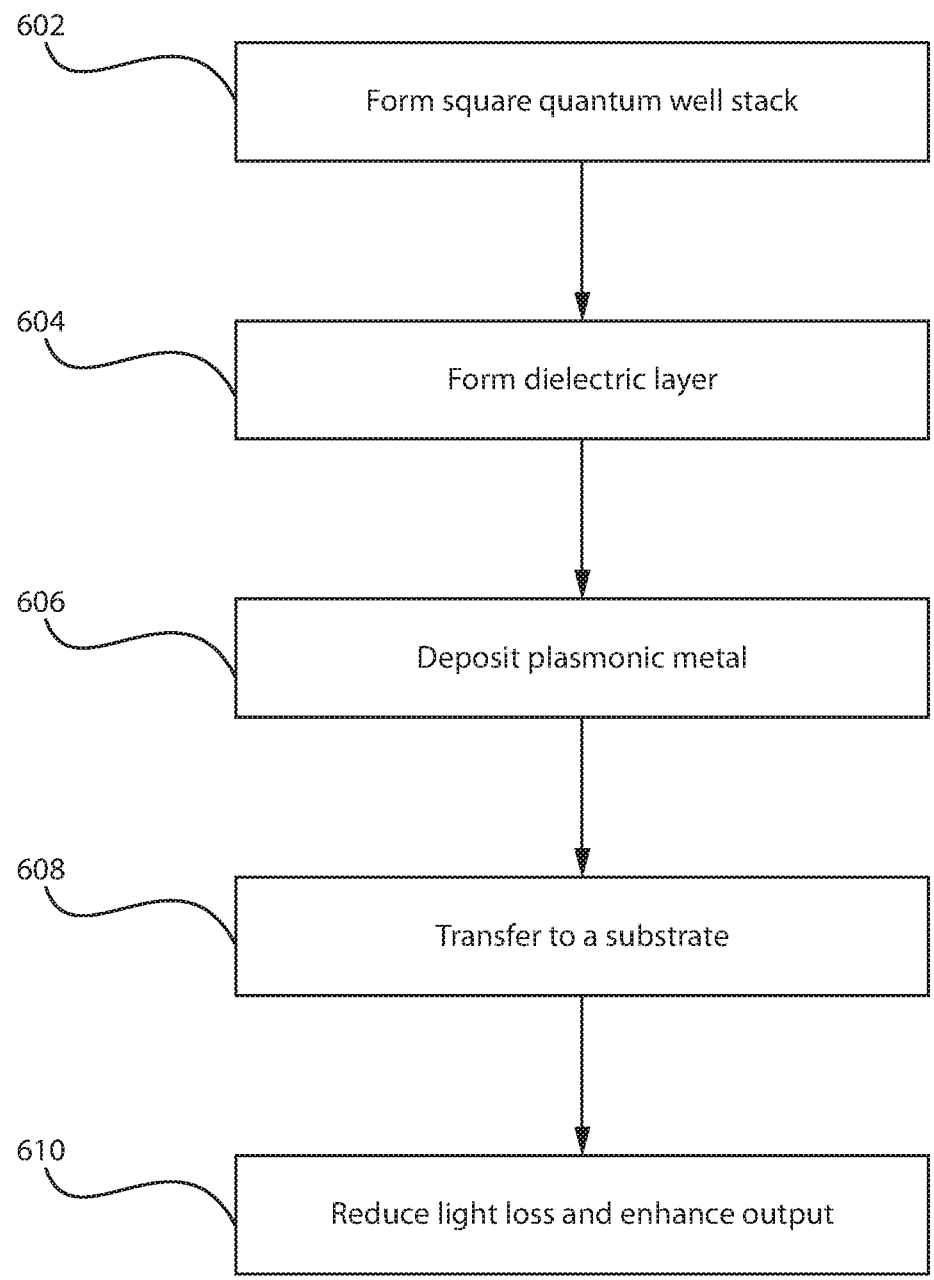
FIG. 7 is a block/flow diagram showing methods for fabricating a plasmonic diode in accordance with embodiments of the present invention.

Referring to FIG. 7, methods for fabricating a light emitting diode are illustratively described and shown. In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 602, a square quantum well structure is formed on a substrate. The quantum well structure preferably includes III-V materials. The square quantum well structure may be formed using a III-V substrate and depositing alternating layers on the surface of the previous layer or substrate. The alternating layers form a stack and can be deposited using epitaxial growth processes to maintain crystal structure. The epitaxial growth processes may include in-situ doping. The layers are patterned and etched using a lithographic patterning technique.

In one embodiment, the alternating layers include GaAs and AlGaAs materials. Other materials can also be employed. A buffer layer or contact can be formed on the stack. In block 604, a dielectric layer is formed on the quantum well structure or stack (e.g., on the buffer/contact layer, if present).

In block 606, a plasmonic metal is deposited on the dielectric layer. The plasmonic metal is configured to excite surface plasmons in a plasmon mode independently of light wavelength generated by the quantum well structure. Conventional plasmonic LEDs need to match a metal resonance wavelength with a semiconductor gain spectrum, however, the present structures can work with any wavelength in a waveguide mode and are not limited to such matching. The plasmonic metal may be deposited using chemical vapor deposition, sputtering, atomic layer deposition or any other suitable process. The plasmonic metal on the stack will be referred to as a plasmonic stack.

In block 608, the substrate is removed from the plasmonic stack, e.g., by an etch process, a mechanical cleaving process, such as, e.g., spalling, etc. The plasmonic stack can be transferred to another substrate by a chip transfer process. The plasmonic stack may be bonded to a glass substrate, an integrated circuit, a semiconductor substrate, etc. The new substrate may include light coupling components, lasers or diodes for optical pumping, electronic components or circuitry, bio-medical processing devices, etc. A second contact or buffer layer may be formed on the exposed portion of the plasmonic stack to complete the device.

The square quantum well structure preferably includes a side dimension of less than about 10 microns, although smaller and sub-micron dimensions are also contemplated. Smaller micro cavity devices are particularly useful in bio-sensing devices and optical links.

In block 610, light loss is reduced from the diode using the plasmonic metal to reflect light. This includes providing a smooth interface with the dielectric layer and proper material selection of the metal and dielectric material of the layer to ensure optimal reflective properties. In one embodiment, using reflective properties and plasmonic excitation, the plasmonic metal enhances emission intensity by at least a factor of 2 over a same device without the plasmonic metal. In useful embodiments, the plasmonic metal is selected from the group consisting of Au, Cu, Ag and Al, although other metals may be employed.

Having described preferred embodiments for a plasmonic light emitting diode (which are intended to be illustrative and not limiting), it is noted that modifications and variations can be made by persons skilled in the art in light of the above teachings. It is therefore to be understood that changes can be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A light emitting diode, comprising:
a light emission structure having a contact; and
a plasmonic layer, including a plasmonic metal and a dielectric layer with a smooth interface therebetween, in contact with a contact of a quantum well structure and configured to excite surface plasmons in a waveguide mode using light generated by the light emission structure to enhance power input to the light emission structure.

2. The light emitting diode as recited in claim 1, wherein the light emission structure includes a square with a side dimension of less than about 10 microns.

3. The light emitting diode as recited in claim 1, wherein the plasmonic metal reduces light loss from the light emitting diode through reflection.

4. The light emitting diode as recited in claim 1, wherein the plasmonic metal enhances emission intensity by a factor of about 2 over a same device without the plasmonic metal.

5. The light emitting diode as recited in claim 1, wherein the plasmonic layer is configured to excite surface plasmons in a waveguide mode that is independent of wavelength generated by the light emission structure.

6. The light emitting diode as recited in claim 1, wherein the dielectric layer includes aluminum oxide.

7. The light emitting diode as recited in claim 1, wherein the light emission structure includes alternating layers of III-V materials.

8. The light emitting diode as recited in claim 7, wherein the alternating layers include GaAs and AlGaAs materials.

9. A light emitting diode, comprising:
a substrate;
a light emission structure mounted on the substrate to generate light using optical pumping; and
a plasmonic layer, including a plasmonic metal and a dielectric layer with a smooth interface therebetween, the plasmonic layer located between the light emission structure and the substrate, and configured to excite surface plasmons in a waveguide mode.

10. The light emitting diode as recited in claim 9, wherein the light emission structure includes a square with a side dimension of less than about 10 microns.

11. The light emitting diode as recited in claim 9, wherein alternating layers include GaAs and AlGaAs materials.

12. The light emitting diode as recited in claim 9, wherein the plasmonic metal reduces light loss from the light emitting diode through reflection.

13. The light emitting diode as recited in claim 9, wherein the plasmonic metal enhances emission intensity by a factor of about 2 over a same device without the plasmonic metal.

14. The light emitting diode as recited in claim 9, wherein the plasmonic layer is configured to excite surface plasmons in a waveguide mode that is independent of wavelength generated by the light emission structure.

15. The light emitting diode as recited in claim 9, wherein the dielectric layer includes aluminum oxide.

16. A method for fabricating a light emitting diode, comprising:
forming a light emission structure on a contact; and
depositing a plasmonic layer, including a plasmonic metal and a dielectric layer, on the contact of the light emission structure, the plasmonic metal being configured to excite surface plasmons in a waveguide mode using light generated by the light emission structure to enhance power input to the light emission structure.

17. The method as recited in claim 16, wherein the light emission structure includes a side dimension of less than about 10 microns.

18. The method as recited in claim 16, further comprising reducing light loss from the light emitting diode using the plasmonic metal to reflect light.

19. The method as recited in claim 16, wherein the plasmonic layer enhances emission intensity by a factor of about 2 over a same device without the plasmonic layer.

20. The method as recited in claim 16, wherein the plasmonic metal is selected from the group consisting of Au, Cu, Ag and Al.

* * * * *